United States Patent
Patterson et al.

(10) Patent No.: US 10,025,202 B2
(45) Date of Patent: Jul. 17, 2018

(54) SUBSTRATE LOADING IN MICROLITHOGRAPHY

(71) Applicant: Molecular Imprints, Inc., Austin, TX (US)

(72) Inventors: Roy Patterson, Hutto, TX (US); Christopher John Fleckenstein, Round Rock, TX (US); Matthew S. Shafran, Fletcher, NC (US); Charles Scott Carden, Autin, TX (US); Satish Sadam, Round Rock, TX (US); Ryan Christiansen, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 15/612,079

(22) Filed: Jun. 2, 2017

(65) Prior Publication Data

US 2018/0031976 A1    Feb. 1, 2018

Related U.S. Application Data

(60) Provisional application No. 62/368,443, filed on Jul. 29, 2016.

(51) Int. Cl.
| | | |
|---|---|---|
| *G03B 27/58* | (2006.01) | |
| *G03F 7/20* | (2006.01) | |
| *G03F 7/00* | (2006.01) | |

(52) U.S. Cl.
CPC ............ *G03F 7/707* (2013.01); *G03F 7/0002* (2013.01)

(58) Field of Classification Search
CPC .............................. G03F 7/0002; G03F 7/707
See application file for complete search history.

(56) References Cited

U.S. PATENT DOCUMENTS

| | | | |
|---|---|---|---|
| 5,677,758 A | 10/1997 | McEachern et al. | |
| 6,054,029 A | 4/2000 | Kempf et al. | |
| 6,805,054 B1 | 10/2004 | Meissl et al. | |
| 9,368,347 B2 * | 6/2016 | Dimitriadis | ........... G03F 7/2028 |
| 2003/0218456 A1 * | 11/2003 | Brunner | ............ H01L 21/67288 |
| | | | 324/750.14 |
| 2004/0058067 A1 | 3/2004 | Law et al. | |
| 2006/0158634 A1 * | 7/2006 | Jacobs | ................ G03F 7/70691 |
| | | | 355/67 |

(Continued)

OTHER PUBLICATIONS

International Search Report and Written Opinion for International Application No. PCT/US2017/035600, dated Aug. 25, 2017, 19 pages.

*Primary Examiner* — Deoram Persaud
(74) *Attorney, Agent, or Firm* — Fish & Richardson P.C.

(57) ABSTRACT

Methods, systems, and apparatus for the loading and unloading of substrates, such as semiconductor wafers, involving microlithography and similar nano-fabrication techniques. The system includes two or more pedestals; a substrate chuck including two or more channels; a turntable having a top surface and a first end positioned opposite a second end, each of the first and second ends including a respective opening, each opening including two or more cutouts and two or more tabs, the turntable rotatable between first and second positions and an actuator system to adjust distances between the turntable and the substrate chuck and between the turntable and the pedestals.

13 Claims, 12 Drawing Sheets

(56) References Cited

U.S. PATENT DOCUMENTS

| | | | |
|---|---|---|---|
| 2010/0037932 A1* | 2/2010 | Erez | H01L 31/188 |
| | | | 136/244 |
| 2010/0109695 A1 | 5/2010 | Dunklee | |
| 2011/0097878 A1* | 4/2011 | Olgado | C23C 16/4587 |
| | | | 438/478 |
| 2012/0021368 A1* | 1/2012 | Sheu | F27B 17/0025 |
| | | | 432/239 |
| 2016/0111278 A1* | 4/2016 | Wamura | H01L 21/68764 |
| | | | 438/782 |
| 2016/0276204 A1* | 9/2016 | Sakata | H01L 21/68764 |
| 2017/0274595 A1* | 9/2017 | Swartz | B33Y 10/00 |
| 2017/0304992 A1* | 10/2017 | Sato | B24B 37/345 |
| 2017/0365288 A1* | 12/2017 | Foad | G11B 5/855 |

* cited by examiner

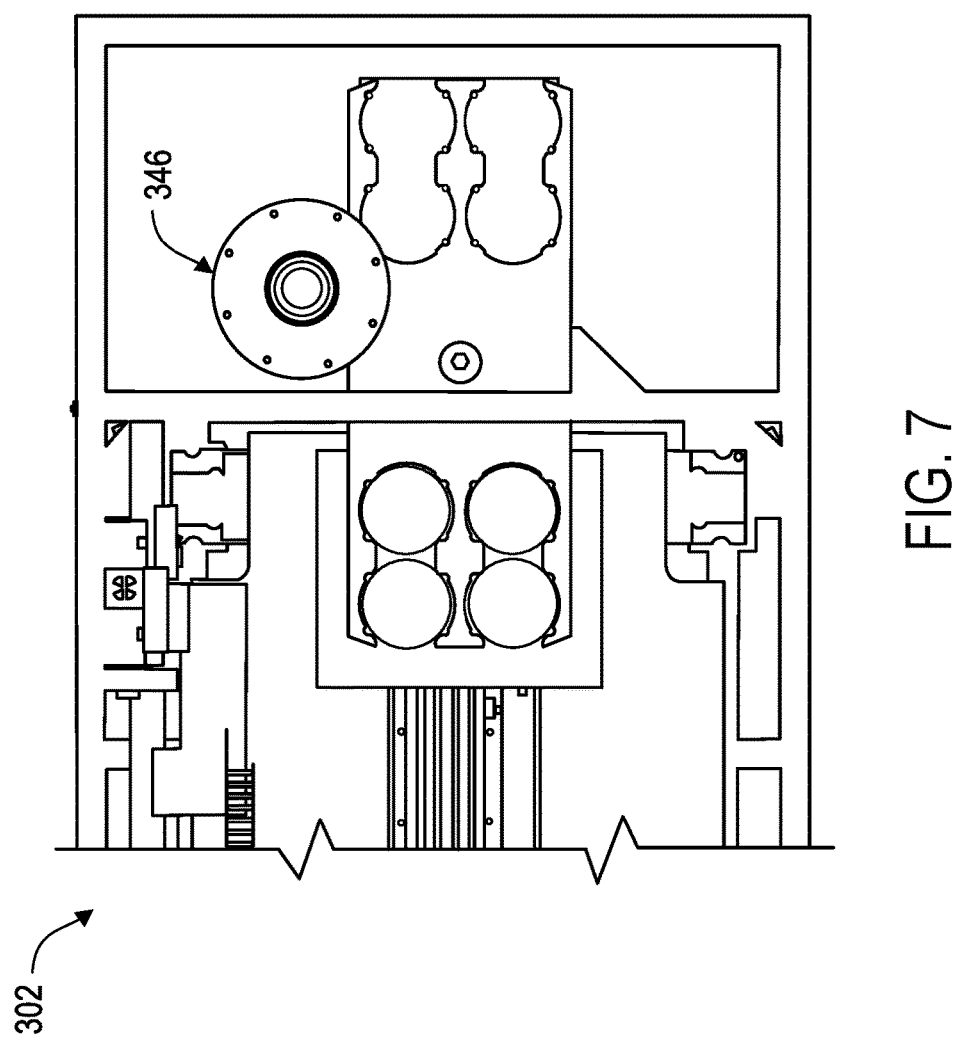

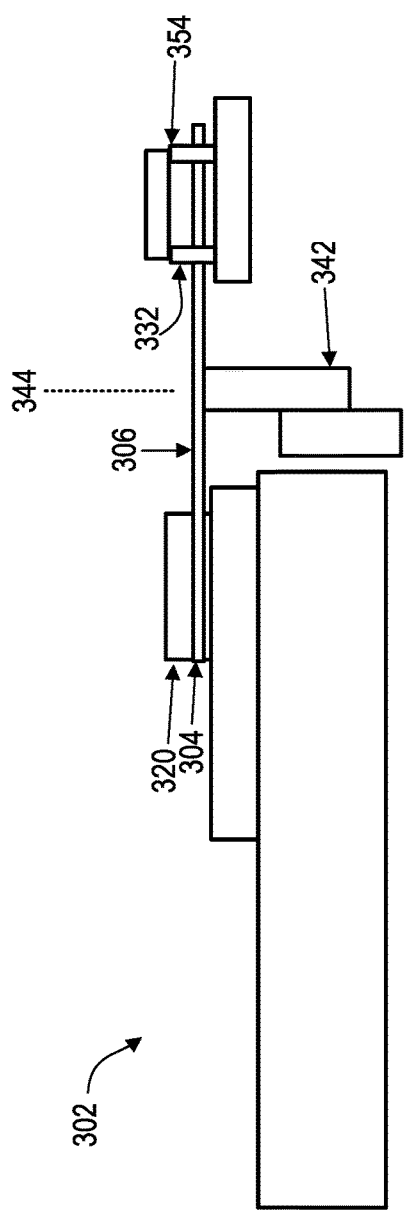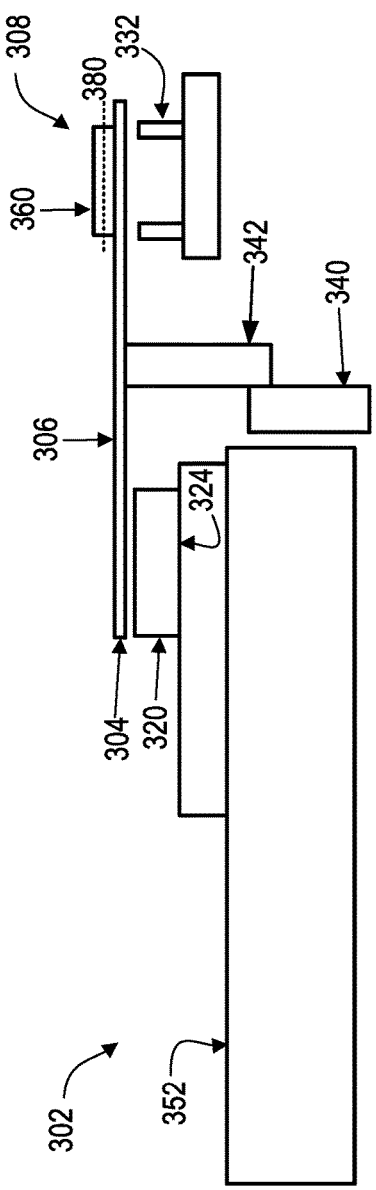

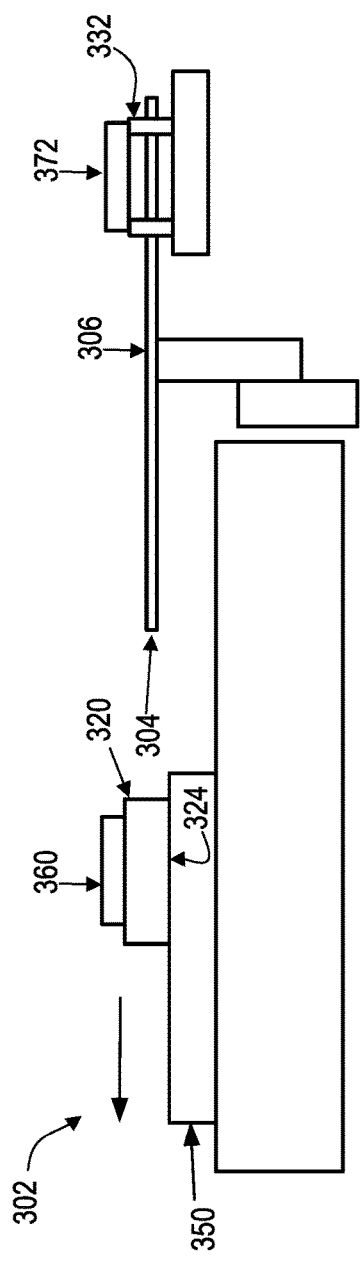
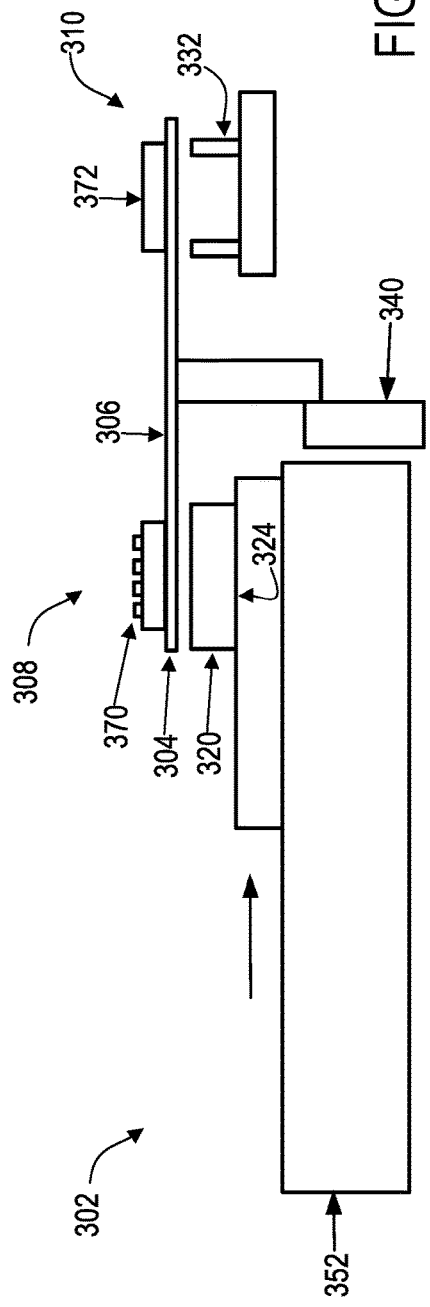

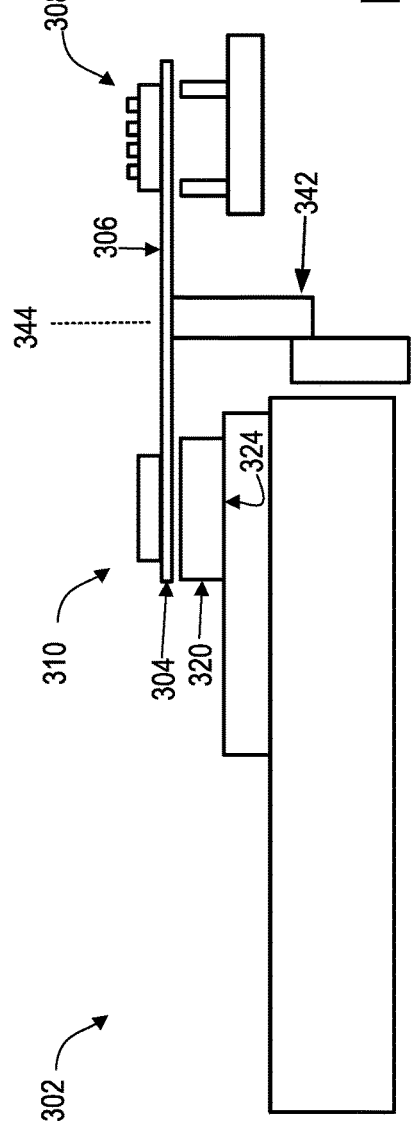
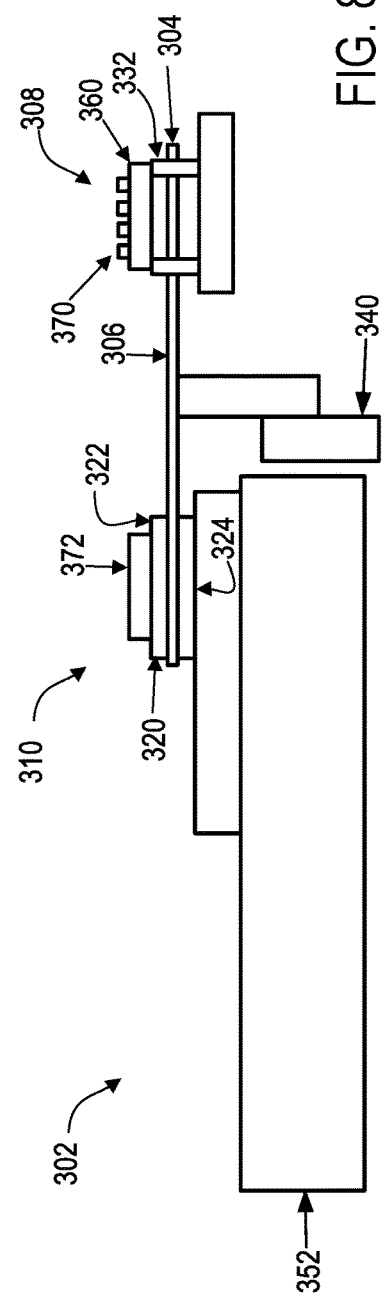

SUBSTRATE LOADING IN MICROLITHOGRAPHY

CROSS-REFERENCE TO RELATED APPLICATION

This application claims priority to U.S. Patent Application Ser. No. 62/368,443, filed on Jul. 29, 2016, the entire contents of which is hereby incorporated by reference.

TECHNICAL FIELD OF THE INVENTION

This invention relates to the loading of substrates, such as semiconductor wafers, in systems and methods involving microlithography and similar nano-fabrication techniques.

BACKGROUND OF THE INVENTION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

Nano-fabrication can include processing of substrates by exposing the substrates to multiple processing modules to form different aspects of a multi-layered structure that includes the substrate, such as etching, photoresist curing, and feature formation. However, transportation of substrates throughout the different modules of a nano-fabrication system can affect throughput of the system.

SUMMARY OF THE INVENTION

Innovative aspects of the subject matter described in this specification may be embodied in methods that include the actions of providing a turntable comprising a top surface and a first end positioned opposite a second end, each of the first and second ends including a respective opening, each opening including two or more cutouts and two or more tabs; providing a substrate chuck comprising a top surface positioned opposite a bottom surface; positioning the turntable in a first position such that i) the two or more cutouts of the opening of the first end are in superimposition with two or more pedestals and ii) a first end of the two or more pedestals extends away from the top surface of the turntable; increasing a distance between the top surface of the turntable and the bottom surface of the substrate chuck to transfer a first substrate from the two or more pedestals to the two or more tabs of the opening of the first end of the turntable; rotating the turntable from the first position to a second position such that i) the two or more tabs of the opening of the first end of the turntable are in superimposition with two or more channels of the substrate chuck and ii) the two or more cutouts of the opening of the second end are in superimposition with the two or more pedestals; and after rotating the turntable from the first position to the second position, decreasing a distance between the top surface of the turntable and the bottom surface of the substrate chuck to transfer the first substrate from the two or more tabs of the opening of the first end of the turntable to the top surface of the substrate chuck while the two or more tabs of the opening of the first end are positioned within the channels of the substrate chuck.

Other embodiments of these aspects include corresponding systems, and apparatus configured to perform the actions of the methods.

These and other embodiments may each optionally include one or more of the following features. For instance, after decreasing the distance between the top surface of the turntable and the bottom surface of the substrate chuck, increasing the distance between the top surface of the turntable and the bottom surface of the substrate chuck such to i) transfer the first substrate, having a patterned formed thereon, from the substrate chuck to the two or more tabs of the opening of the first end of the turntable and ii) transfer a second substrate from the two or more pedestals to the two or more tabs of the opening of the second end of the turntable. In some examples, after increasing the distance between the top surface of the turntable and the bottom surface of the substrate chuck, rotating the turntable from the second position to the first position such that i) the two or more cutouts of the opening of the first end are in superimposition with the two or more pedestals and ii) the two or more tabs of the opening of the second end of the turntable are in superimposition with the two or more channels of the substrate chuck. In some examples, after rotating the turntable from the second position to the first position, decreasing the distance between the top surface of the turntable and the bottom surface of the substrate chuck to i) transfer the second substrate from the two or more tabs of the opening of the second end of the turntable to the top surface of the substrate chuck while the two or more tabs of the opening of the second end of the turntable are positioned within the channels of the substrate chuck and ii) transfer the first substrate, having a patterned formed thereon, from the two or more tabs of the opening of the first end of the turntable to the two or more pedestals.

The features further include, for example, a plane of the first substrate is maintained during the rotation of the turntable from the first position to the second position. In some examples, after decreasing the distance between the top surface of the turntable and the bottom surface of the substrate chuck, forming a pattern on the first substrate. In some examples, prior rotating the turntable from the first position to the second position, rotating the turntable from the first position to a third position such that the first substrate positioned on the two or more tabs of the opening of the first end of the turntable is in superimposition with an inspection station; and inspecting, by the inspection station and while the turntable is in the third position, the first substrate for one or more defects.

Innovative aspects of the subject matter described in this specification may be embodied in a system that includes two or more pedestals; a substrate chuck having a top surface positioned opposite a bottom surface, and including two or more channels; a turntable having a top surface and a first end positioned opposite a second end, each of the first and second ends including a respective opening, each opening including two or more cutouts and two or more tabs, the turntable rotatable between first and second positions, the first position having i) the two or more cutouts of the opening of the first end in superposition with the two or more pedestals and ii) a first end of the two or more pedestals extending away from the top surface of the turntable, the second position having i) the two or more tabs of the opening of the first end of the turntable in superimposition with the two or more channels of the substrate chuck and ii) the two or more cutouts of the opening of the second end in superimposition with the two or more pedestals; and an actuator system to, when the turntable is in the first position, decrease a distance between the top surface of the turntable and the first end of two or more pedestals to transfer a first substrate from the two or more pedestals to the two or more tabs of the opening of the first end of the turntable, and when the turntable is in the second position, decrease a distance between the top surface of the turntable and the bottom surface of the substrate chuck to transfer the first substrate from the two or more tabs of the opening of the first end of the turntable to the top surface of the substrate chuck while the two or more tabs are positioned within the channels of the substrate chuck.

Other embodiments of these aspects include corresponding methods performed by the system.

These and other embodiments may each optionally include one or more of the following features. For instance, the actuator system is further configured to increase the distance the distance between the top surface of the turntable and the bottom surface of the substrate to i) transfer the first substrate, having a patterned formed thereon, from the substrate chuck to the two or more tabs of the opening of the first end of the turntable and ii) transfer the second substrate from the two or more pedestals to the two or more tabs of the opening of the second end of the turntable. In some examples, the system includes a rotational system to rotate the turntable between the first and the second positions. In some examples, a plane of the first substrate is maintained while positioned on the two or more tabs of the opening of the first end of the turntable. In some examples, the system includes a patterning system to form a pattern in the first substrate when the first substrate is positioned on the top surface of the substrate chuck. In some examples, the system includes an inspection station, wherein the turntable is further rotatable to a third position such that the first substrate positioned on the two or more tabs of the opening of the first end of the turntable is in superimposition with an inspection station, the inspection station, when the turntable is in the third position, inspect the first substrate for one or more defects.

Particular implementations of the subject matter described in this specification can be implemented so as to realize one or more of the following advantages. Implementations of the present disclosure may improve the transportation of substrates resulting in lowering loading/unloading times of the substrates, and increased throughput.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF DRAWINGS

FIG. 7 illustrates a top down view of the substrate loading system.

FIGS. 8A-8H illustrate simplified side views of the substrate loading system, including loading and unloading of substrates to and from pedestals and the substrate chuck.

DETAILED DESCRIPTION

The following description is of a method and system featuring the loading and unloading of substrates, such as semiconductor wafers, involving microlithography and similar nano-fabrication techniques. Specifically, a turntable is provided having a top surface and a first end positioned opposite a second end. In some examples, each of the first and second ends including a respective opening, each opening including two or more cutouts and two or more tabs. A substrate chuck is provided having a top surface positioned opposite a bottom surface. The turntable is positioned in a first position such that i) the two or more cutouts of the opening of the first end are in superimposition with two or more pedestals and ii) a first end of the two or more pedestals extends away from the top surface of the turntable. A distance is increased between the top surface of the turntable and the bottom surface of the substrate chuck to transfer a first substrate from the two or more pedestals to the two or more tabs of the opening of the first end of the turntable. The turntable is rotated from the first position to a second position such that i) the two or more tabs of the opening of the first end of the turntable are in superimposition with two or more channels of the substrate chuck and ii) the two or more cutouts of the opening of the second end are in superimposition with the two or more pedestals. After rotating the turntable from the first position to the second position, a distance is decreased between the top surface of the turntable and the bottom surface of the substrate chuck to transfer the first substrate from the two or more tabs of the opening of the first end of the turntable to the top surface of the substrate chuck while the two or more tabs of the opening of the first end are positioned within the channels of the substrate chuck.

Figure 1:
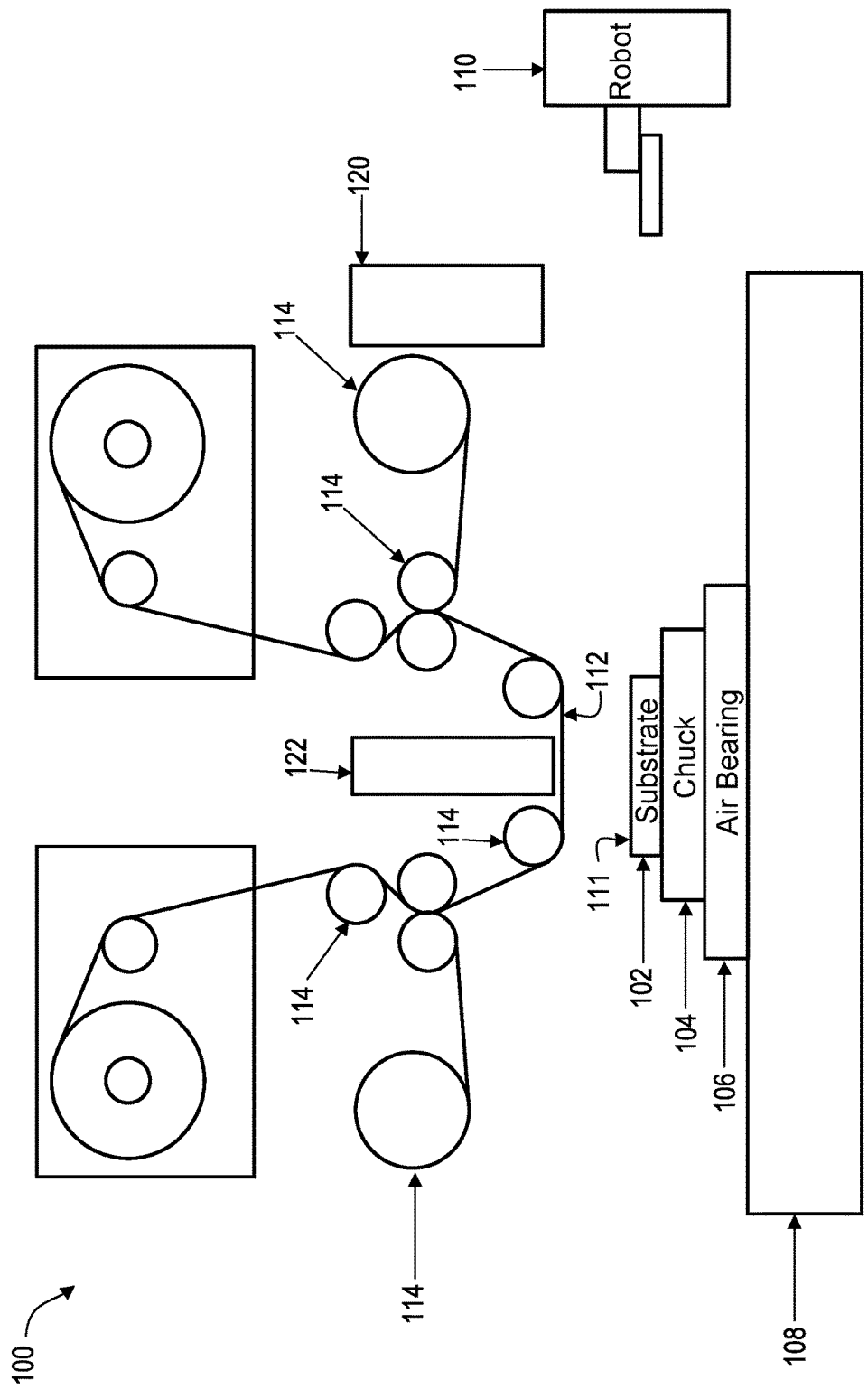
FIG. 1 illustrates a simplified side view of a lithographic system.

FIG. 1 illustrates an imprint lithography system 100 that forms a relief pattern on a substrate 102. The substrate 102 may be coupled to a substrate chuck 104. In some examples, the substrate chuck 104 can include a vacuum chuck, a pin-type chuck, a groove-type chuck, an electromagnetic chuck, and/or the like. In some examples, the substrate 102 and the substrate chuck 104 may be further positioned on an air bearing 106. The air bearing 106 provides motion about the x-, y-, and/or z-axes. In some examples, the substrate 102 and the substrate chuck 104 are positioned on a stage. The air bearing 106, the substrate 102, and the substrate chuck 104 may also be positioned on a base 108. In some examples, a robotic system 110 positions the substrate 102 on the substrate chuck 104.

The substrate 102 can include a planar surface 111 positioned opposite the substrate chuck 104. In some examples, the substrate 102 can be associated with a thickness that is substantially uniform (constant) across the substrate 102.

The imprint lithography system 100 further includes an imprint lithography flexible template 112 that is coupled to one or more rollers 114, depending on design considerations. The rollers 114 provide movement of a least a portion of the flexible template 112. Such movement may selectively provide different portions of the flexible template 112 in superimposition with the substrate 102. In some examples, the flexible template 112 includes a patterning surface that includes a plurality of features, e.g., spaced-apart recesses and protrusions. However, in some examples, other configurations of features are possible. The patterning surface may define any original pattern that forms the basis of a pattern to be formed on substrate 102. In some examples, the flexible template 112 may be coupled to a template chuck, e.g., a vacuum chuck, a pin-type chuck, a groove-type chuck, an electromagnetic chuck, and/or the like.

The imprint lithography system 100 may further comprise a fluid dispense system 120. The fluid dispense system 120 may be used to deposit a polymerizable material on the substrate 102. The polymerizable material may be positioned upon the substrate 102 using techniques such as drop dispense, spin-coating, dip coating, chemical vapor deposition (CVD), physical vapor deposition (PVD), thin film deposition, thick film deposition, and/or the like. In some examples, the polymerizable material is positioned upon the substrate 102 as a plurality of droplets.

Figure 2:
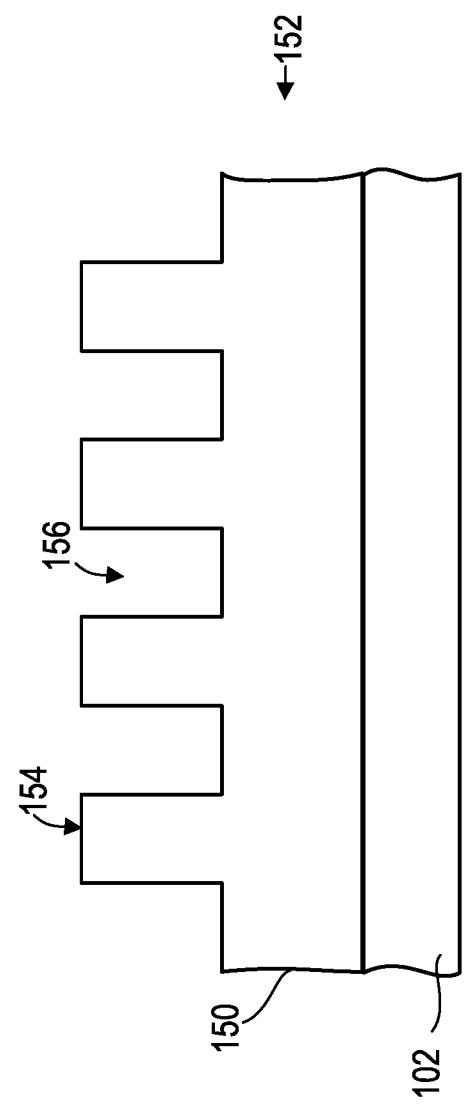
FIG. 2 illustrates a simplified side view of a substrate having a patterned layer positioned thereon.

Referring to FIGS. 1 and 2, the imprint lithography system 100 may further comprise an energy source 122 coupled to direct energy towards the substrate 102. In some examples, the rollers 114 and the air bearing 106 are configured to position a desired portion of the flexible template 112 and the substrate 102 in a desired positioning. The imprint lithography system 100 may be regulated by a processor in communication with the air bearing 106, the rollers 114, the fluid dispense system 120, and/or the energy source 122, and may operate on a computer readable program stored in a memory.

In some examples, the rollers 114, the air bearing 106, or both, vary a distance between the flexible template 112 and the substrate 102 to define a desired volume therebetween that is filled by the polymerizable material. For example, the flexible template 112 contacts the polymerizable material. After the desired volume is filled by the polymerizable material, the energy source 122 produces energy, e.g., broadband ultraviolet radiation, causing the polymerizable material to solidify and/or cross-link conforming to shape of a surface of the substrate 102 and a portion of the patterning surface of the flexible template 122, defining a patterned layer 150 on the substrate 102. In some examples, the patterned layer 150 may comprise a residual layer 152 and a plurality of features shown as protrusions 154 and recessions 156.

Figure 3:
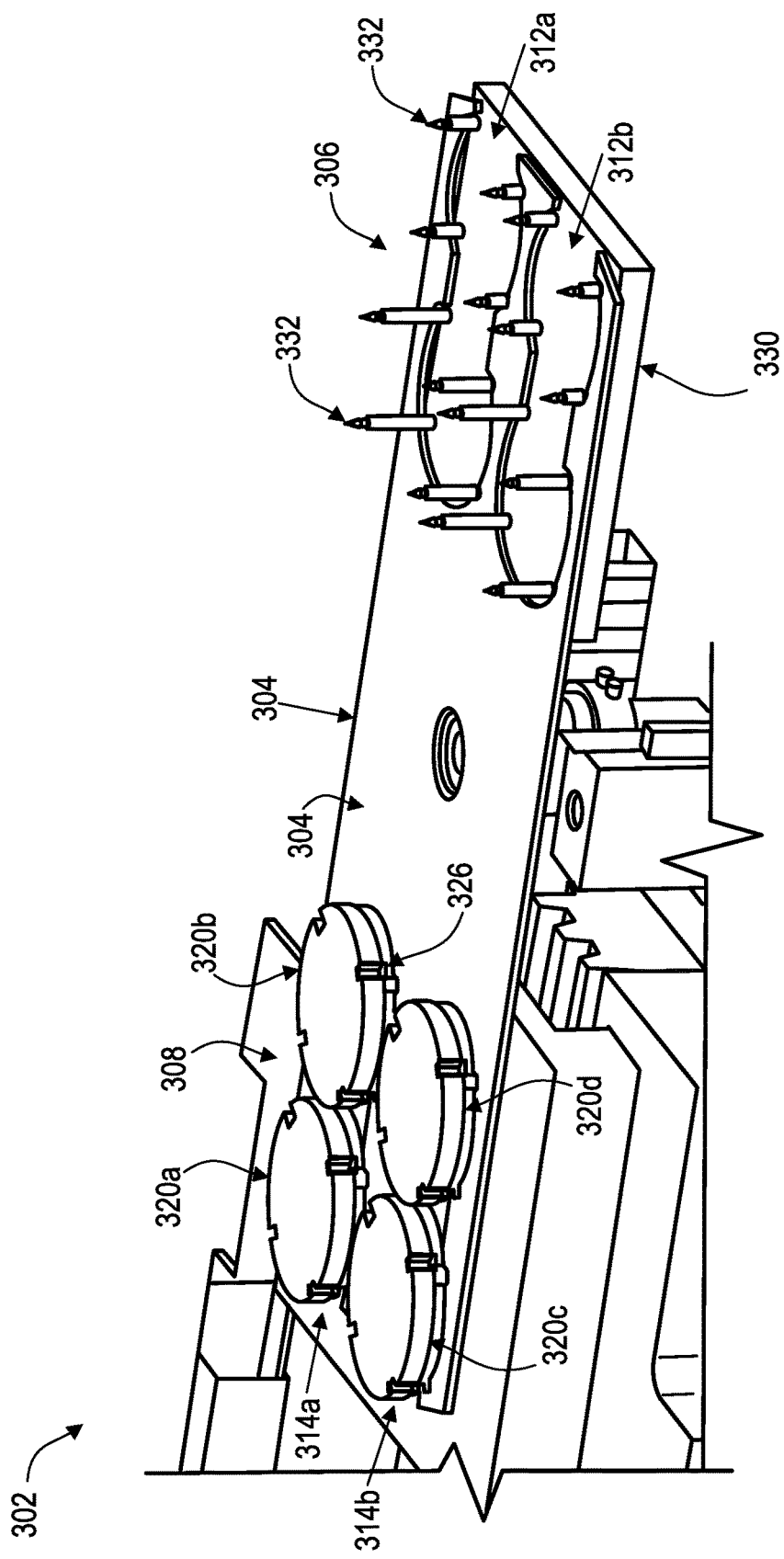
FIG. 3 illustrates a perspective view of a substrate loading system, including a turntable.
Figure 4:
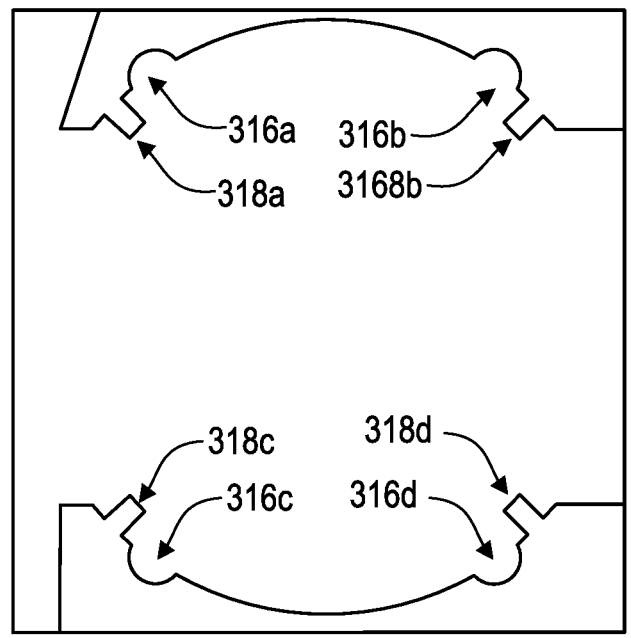
FIG. 4 illustrates a top down view of one of a portion of the turntable.

FIG. 3 illustrates a perspective view of a substrate loading system 302. In short, the substrate loading system 302 facilitates loading and unloading of substrates to and from one or more stations (e.g., pedestals and/or substrate chucks). The substrate loading system 302 includes a turntable 304 having a top surface 306 and a first end 308 positioned opposite a second end 310. The first end 308 includes openings 312a, 312b (collectively referred to as openings 312); and the second end 310 includes openings 314a, 314b (collectively referred to as openings 314). However, the first end 308 and the second end 310 including any number of openings 314 and 316, respectively. Each of the openings 312, 314, include cutouts and tabs. Specifically, FIG. 4 illustrates a top down view of one of the openings 312, 314, that includes cutouts 316a, 316b, 316c, 316d (collectively referred to as cutouts 316) and tabs 318a, 318b, 318c, 318d (collectively referred to as tabs 318). However, each of the openings 312, 314 can include any number of cutouts 316 and tabs 318.

Figure 5:
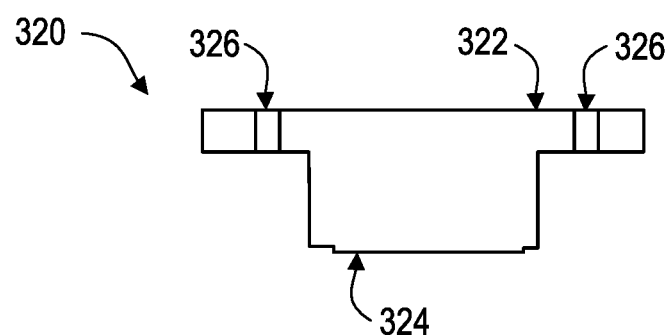
FIG. 5 illustrates a side view of a substrate chuck.

The substrate loading system 302 further includes substrate chucks 320a, 320b, 320c, 320d (collectively referred to as substrate chucks 320); however, the system 302 can include any number of substrate chucks 320. FIG. 5 illustrates a side view of one of the substrate chucks 320. The substrate chuck 320 includes a top surface 322 positioned opposite a bottom surface 324. The substrate chuck 320 also includes channels 326 positioned at a perimeter of each substrate chuck 320. In some examples, for a particular opening 312, 314, the quantity of the channels 326 matches the quantity of the tabs 318 of the particular opening 312, 314. The substrate loading system 302 further includes a pedestal platform 330 that includes a plurality of pedestals 332. In some examples, a first subset of the pedestals 332 can be associated with a first height, and a second subset of the pedestals 332 can be associated with a second height.

Figure 6:
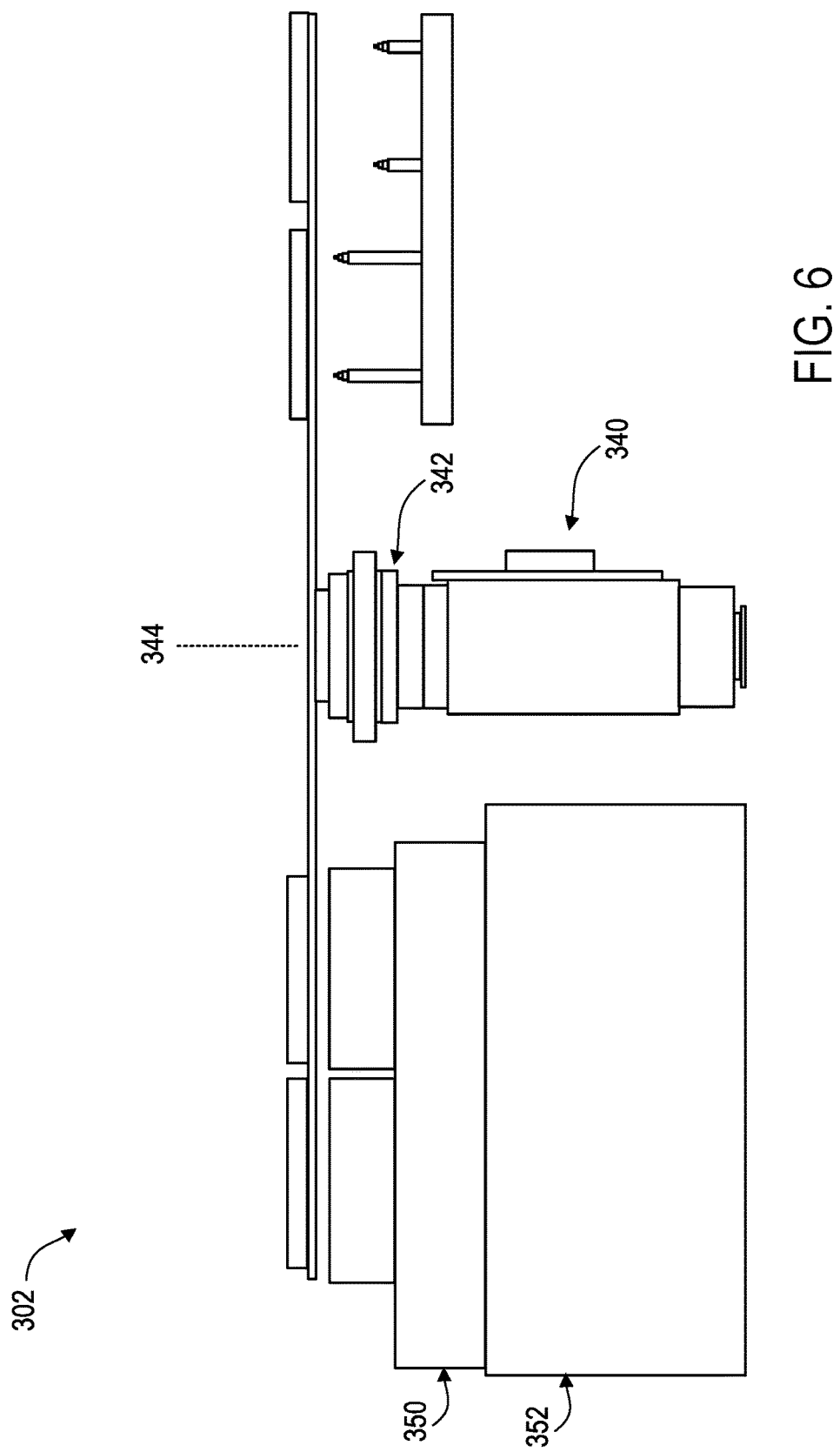
FIG. 6 illustrates a side view of the substrate loading system.

Referring to FIG. 6, a side view of the substrate loading system 302 is shown. The substrate loading system 302 further includes an actuator system 340 and a rotational system 342. The actuator system 340 increases and/or decreases a relative positioning of the turntable 304 with respect to the substrate chucks 320 and the pedestals 332. The rotational system 342 rotates the turntable 304 with respect to an axis 344. The substrate loading system 302 further includes an air bearing 350 and a support structure 352. In some examples, the air bearing 350 facilitates movement of the substrate chucks 320 about the support structure 352. Referring to FIG. 7, a top down view of the substrate loading system 302 is shown. The substrate loading system 302 further includes an inspection station 346 that inspects substrates for one or more defects.

Figure 8C:
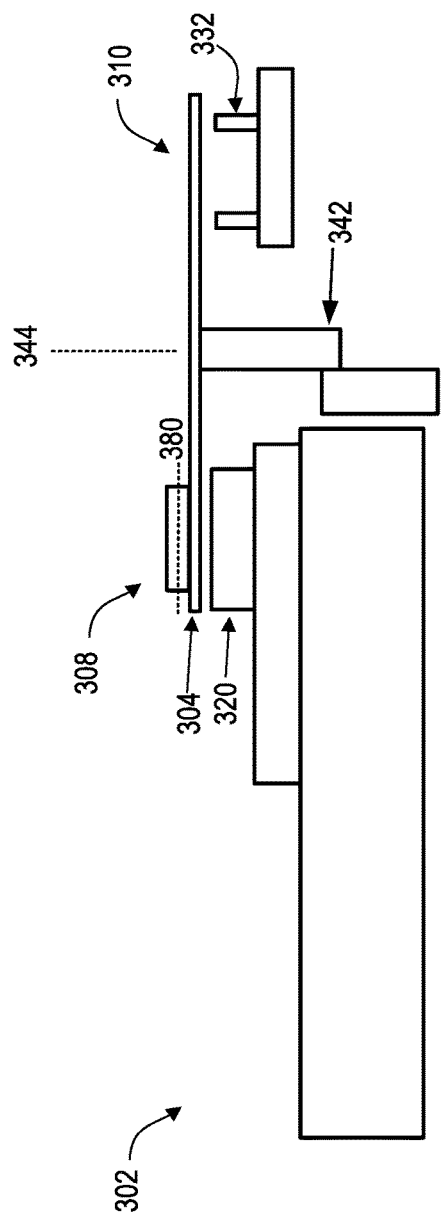

Referring to FIGS. 8A-8H, the substrate loading system 302 is shown facilitating loading and unloading of substrates to and from the pedestals 332 and the substrate chucks 320. Specifically, in some implementations, as shown in FIG. 8A, the rotational system 342 positions the turntable 304 to be in a first position. Specifically, the rotational system 342 rotates the turntable 304 about the axis 344 such that the turntable is in the first position. In some examples, positioning the turntable 304 in the first position by the rotational system 342 includes having the cutouts 316 of each of the openings 312 of the first end 308 in superimposition with the pedestals 332. In some examples, positioning the turntable 304 in the first position by the rotational system 342 includes having a first end 354 of each of the pedestals 332 extend away from the top surface 306 of the turntable 304.

In some implementations, as shown in FIG. 8B, the actuator system 340 increases a distance between the top surface 306 of the turntable 304 and the bottom surface 324 of the substrate chuck 320. That is, the actuator system 340 translates along a direction away from the support structure 352. In some examples, increasing the distance between the top surface 306 of the turntable 304 and bottom surface 324 of the substrate chuck 320 includes transferring a first substrate 360 from being positioned on the pedestals 332 to the tabs 318 of the opening 312 of the first end 308 of the turntable 304.

In some examples, by transferring the first substrate 360 to the tabs 318 of the opening 312 of the first end 308 of the turntable 304, contact with the first substrate 360 is minimized. That is, by contacting the first substrate 360 with only by the tabs 318 of the turntable 304, contact between such is minimized. By minimizing contact with the first substrate 360, e.g., by the tabs 318, introduction of possible defects to the first substrate 360 are minimized, as well as, minimizing particle contamination of the first substrate 360 by the turntable 304.

In some implementations, as shown in FIG. 8C, the rotational system 342 rotates the turntable 304 from the first position to a second position. Specifically, the rotational system 342 rotates the turntable 304 about the axis 344 such that the turntable 304 is in the second position. In some examples, positioning the turntable 304 in the second position includes having the tabs 318 of the opening 312 of the first end 308 of the turntable 304 in superimposition with the channels 326 of the substrate chuck 320. In some examples, positioning the turntable 304 in the second position includes having the cutouts 316 of the opening 314 of the second end 310 of the turntable 304 in superimposition with the pedestals 332.

In some examples, a plane of the first substrate 360 is maintained during rotation of the turntable 304 from the first position to the second position. Specifically, as shown in FIG. 8B, the first substrate 360 lays about a plane 380. To that end, during rotation of the turntable 304 from the first positon to the second position, the plane 380 of the first substrate 360 is maintained, as shown in FIG. 8C. In some examples, maintaining the plane 380 of the first substrate 360 includes minimizing, if not preventing, undesirable angular movement of the first substrate 360 (e.g., with respect to the plane 380). In some examples, the plane 380 of the first substrate 360 is maintained throughout any or all portions of loading and unloading of the first substrate 360 to and from the pedestals 332 and the substrate chuck 320.

Figure 8D:
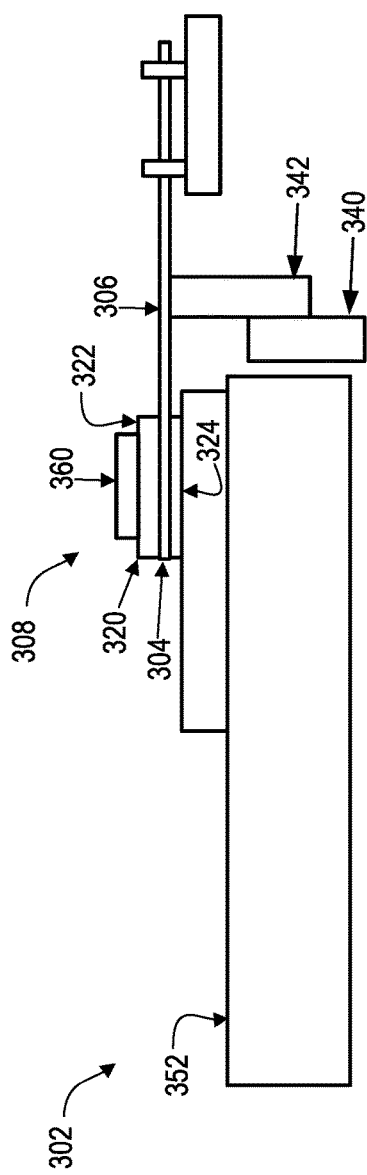

In some implementations, as shown in FIG. 8D, after the rotational system 342 rotates the turntable 304 from the first position to the second position, the actuator system 340 decreases a distance between the top surface 306 of the turntable 304 and the bottom surface 324 of the substrate chuck 320. That is, the actuator system 340 translates along a direction towards the support structure 352. In some examples, decreasing the distance between the top surface 306 of the turntable 304 and the bottom surface 324 of the substrate chuck 320 includes transferring the substrate 360 from the tabs 318 of the opening 312 of the first end 308 of the turntable 304 to the top surface 322 of the substrate chuck 320 while the tabs 318 of the opening 312 of the first end 308 of the turntable 304 are positioned within the channels 326 of the substrate chuck 320.

In some implementations, as shown in FIG. 8E, after decreasing the distance between the top surface 306 of the turntable 304 and the bottom surface 324 of the substrate chuck 320, a patterning system, e.g., as shown in FIG. 1, forms a pattern in (or in a layer positioned on) the first substrate 360. Specifically, the air bearing 350 facilitates movement of the substrate chuck 320 about the support structure 352 in a direction away from the turntable 320 and towards the patterning system (not shown). In some examples, concurrently with forming a pattern in the first substrate 360 (or concurrently with a portion of the process of forming a pattern in the first substrate 360), a robotic system (not shown) positions a second substrate 372 on the pedestals 332.

In some implementations, as shown in FIG. 8F, after decreasing the distance between the top surface 306 of the turntable 304 and the bottom surface 324 of the substrate chuck 320, the actuator system 340 increases the distance between the top surface 306 of the turntable 304 and the bottom surface 324 of the substrate chuck 320. That is, the actuator system 340 translates along a direction away from the support structure 352. In some examples, the actuator system 340 increases the distance between the top surface 306 of the turntable 304 and the bottom surface 324 of the substrate 320 after forming a pattern in the first substrate 360, as described with respect to FIG. 8E; that is, after the air bearing 350 facilitates movement of the substrate chuck 320 about the support structure 352 in a direction towards the turntable 320 and away from the patterning system (not shown).

In some examples, increasing the distance between the top surface 306 of the turntable 304 and the bottom surface 324 of the substrate chuck 320 includes transferring the first substrate 360, having the pattern 370 formed thereon, from the substrate chuck 320 to the tabs 318 of the opening 312 of the first end 308 of the turntable 304. In some examples, increasing the distance between the top surface 306 of the turntable 304 and the bottom surface 324 of the substrate chuck 320 includes transferring the second substrate 372 from the pedestals 332 to the tabs 318 of the opening 314 of the second end 310 of the turntable 304.

In some implementations, as shown in FIG. 8G, after increasing the distance between the top surface 306 of the turntable 304 and the bottom surface 324 of the substrate chuck 320, the rotational system 342 rotates the turntable 304 from the second position to the first position. Specifically, the rotational system 342 rotates the turntable 304 about the axis 344 such that the turntable 304 is in the first position. In some examples, positioning the turntable in the first position includes having the cutouts 316 of the opening 312 of the first end 308 of the turntable 304 in superimposition with the pedestals 332. In some examples, positioning the turntable 304 in the first position includes having the tabs 318 of the second end 310 of the turntable 304 in superimposition with the channels 326 of the substrate chuck 320.

In some implementations, as shown in FIG. 8H, after rotating the turntable from the second position to the first position, the actuator system 340 decreases the distance between the between the top surface 306 of the turntable 304 and the bottom surface 324 of the substrate chuck 320. That is, the actuator system 340 translates along a direction towards from the support structure 352. In some examples, decreasing the distance between the between the top surface 306 of the turntable 304 and the bottom surface 324 of the substrate chuck 320 includes transferring the second substrate 372 from the tabs 318 of the second end 310 of the turntable 304 to the top surface 322 of the substrate chuck 320 while the tabs 318 of the opening 314 of the second end 310 of the turntable 304 are positioned within the channels 326 of the substrate chuck 320. In some examples, decreasing the distance between the between the top surface 306 of the turntable 304 and the bottom surface 324 of the substrate chuck 320 includes transferring the first substrate 360, having the patterned 370 formed thereon, from the tabs 318 of the opening 312 of the first end 308 of the turntable 304 to the pedestals 332.

In some examples, the second substrate 372 can be processed similar to that described above with respect to the first substrate 360, and specifically, that the process described in FIGS. 8A-8H can be applied to the second substrate 372. In some examples, any of the steps of FIGS. 8A-8H can happen serially, or in parallel.

For simplicity of illustration, a single first substrate 360, a single second substrate 372, and a single substrate chuck 320 are shown; however the process of FIGS. 8A-8H can be applied to a plurality of first substrates 360 and plurality of second substrates 372 with respect to a plurality of substrate chucks 320. That is, a plurality of first substrates 360 and a plurality of second substrates 372 can be subject to the process of FIGS. 8A-8H, concurrently.

Figure 9:
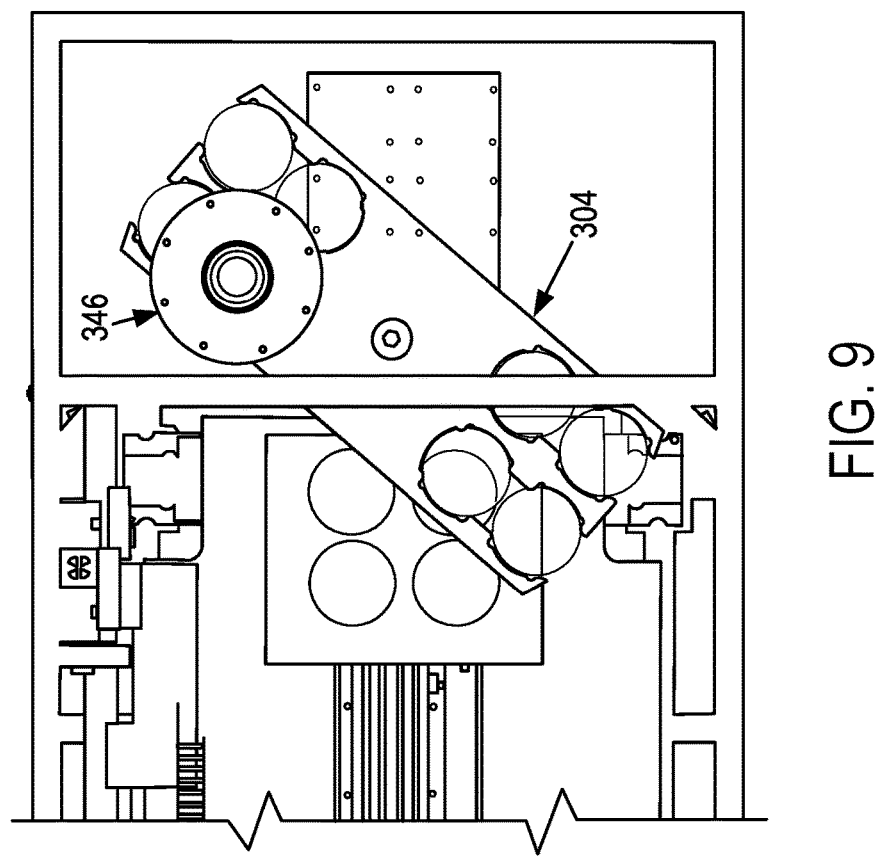
FIG. 9 illustrates a top down view of the substrate loading system, including an inspection station.

In some implementations, as shown in FIG. 9, prior to the rotational system 342 rotating the turntable 304 from the first position to the second position, the rotational system 342 rotates the turntable 304 from the first position to a third position. Specifically, the rotational system 342 rotates the turntable 304 about the axis 344 such that the turntable 304 is in a third position. In some examples, positioning the turntable 304 in the third position includes having the tabs of the opening 312 of the first end 308 of the turntable 304 in superimposition with the inspection station 346. In some examples, when the turntable is positioned in the third position, the inspection station 346 inspects the first substrate 360 for one or more defects.

In some implementations, the rotational system 342 rotates the turntable 304 to a fourth position. Specifically, the rotational system 342 rotates the turntable 304 about the axis 344 such that the turntable 304 is in the fourth position. In some examples, the fourth position includes having the opening 312 of the first end 308 of the turntable 304 in superimposition with a deposition station (not shown). Specifically, in some examples, the rotational system 342 rotates the turntable 304 to the fourth position after forming the patterned layer 370 on the first substrate 360, that is, the first substrate 360 in superimposition with the deposition station. The deposition station can include an inkjet fluid dispensing system that dispense a reflective material layer on the patterned layer 370. In some examples, the reflective material layer can include aluminum and/or silver.

In some examples, the first end 308 of the turntable 304 can be positioned in superimposition with the deposition station concurrently with the second end 310 of the turntable 304 in superimposition with the inspection station 346. In some examples, the first end 308 of the turntable 304 can be positioned in superimposition with the deposition station concurrently with the second end 310 of the turntable 304 in superimposition with the pedestals 332; or in superimposition with the substrate chuck 320.

Figure 10:
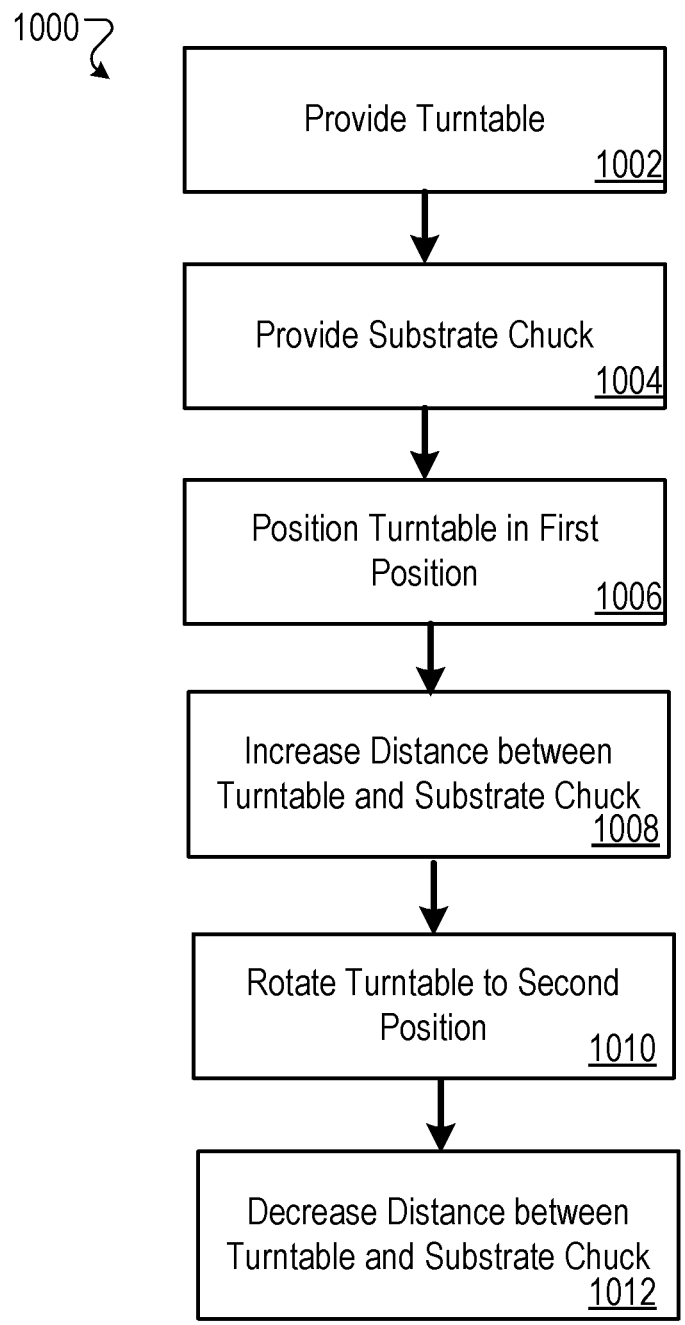
FIG. 10 illustrates an example method for loading and unloading of substrates to and from pedestals and the substrate chuck.

FIG. 10 illustrates an example method for loading and unloading of substrates to and from pedestals and the substrate chuck. The process 1000 is illustrated as a collection of referenced acts arranged in a logical flow graph. The order in which the acts are described is not intended to be construed as a limitation, and any number of the described acts can be combined in other orders and/or in parallel to implement the process.

Turntable 304 is provided having the top surface 306 and the first end 308 positioned opposite the second end 310 (1002). In some examples, each of the first end 308 and second end 310 include a respective opening 312, 314. In some examples, each opening 312, 314 includes two or more cutouts 316 and two or more tabs 318. The substrate chuck 320 is provided having the top surface 322 positioned opposite the bottom surface 332 (1004). The turntable 304 is positioned in a first position (1006). For example, the rotational system 342 rotates the turntable 304 to the first position. In some examples, positioning the turntable 304 in the first position includes i) the two or more cutouts 316 of the opening 312 of the first end 308 in superimposition with two or more pedestals 332 and ii) the first end 354 of the two or more pedestals 332 extending away from the top surface 306 of the turntable 304.

A distance between the top surface 306 of the turntable 304 and the bottom surface 332 of the substrate chuck 320 is increased (1008). For example, the actuator system 340 increases the distance between the top surface 306 of the turntable 304 and the bottom surface 332 of the substrate chuck 320. In some examples, the distance between the top surface 306 of the turntable 304 and the bottom surface 332 of the substrate chuck 320 is increased to transfer the first substrate 360 from the pedestals 332 to the tabs 318 of the opening 312 of the first end 308 of the turntable 306.

The turntable 304 is rotated from the first position to the second position (1010). For example, the rotational system 342 rotates the turntable 304 from the first position to the second position. In some examples, rotating the turntable 304 from the first position includes i) the tabs 318 of the opening 312 of the first end 308 of the turntable 306 in superimposition with channels 326 of the substrate chuck 320 and ii) the cutouts 316 of the opening 314 of the second end 310 are in superimposition with the pedestals 332.

After rotating the turntable 304 from the first position to the second position, a distance between the top surface 306 of the turntable 304 and the bottom surface 3323 of the substrate chuck 320 is decreased (1012). For example, the actuator system 340 decreases the distance between the top surface 306 of the turntable 304 and the bottom surface 332 of the substrate chuck. In some examples, the distance between the top surface 306 of the turntable 304 and the bottom surface 3323 of the substrate chuck 320 is decreased to transfer the first substrate 360 from the tabs 318 of the opening 312 of the first end 308 of the turntable 304 to the top surface 322 of the substrate chuck 320 while the tabs 318 of the opening 312 of the first end 308 are positioned within the channels 326 of the substrate chuck 320.

The invention claimed is:

1. An imprint lithography method, comprising:
   providing a turntable comprising a top surface and a first end positioned opposite a second end, each of the first and second ends including a respective opening, each opening including two or more cutouts and two or more tabs;
   providing a substrate chuck comprising a top surface positioned opposite a bottom surface;
   positioning the turntable in a first position such that i) the two or more cutouts of the opening of the first end are in superimposition with two or more pedestals and ii) a first end of the two or more pedestals extends away from the top surface of the turntable;
   increasing a distance between the top surface of the turntable and the bottom surface of the substrate chuck to transfer a first substrate from the two or more pedestals to the two or more tabs of the opening of the first end of the turntable;
   rotating the turntable from the first position to a second position such that i) the two or more tabs of the opening of the first end of the turntable are in superimposition with two or more channels of the substrate chuck and ii) the two or more cutouts of the opening of the second end are in superimposition with the two or more pedestals; and
   after rotating the turntable from the first position to the second position, decreasing a distance between the top surface of the turntable and the bottom surface of the substrate chuck to transfer the first substrate from the two or more tabs of the opening of the first end of the turntable to the top surface of the substrate chuck while the two or more tabs of the opening of the first end are positioned within the channels of the substrate chuck.

2. The imprint lithography method of claim 1, further comprising:
   after decreasing the distance between the top surface of the turntable and the bottom surface of the substrate chuck, increasing the distance between the top surface of the turntable and the bottom surface of the substrate chuck such to i) transfer the first substrate, having a patterned formed thereon, from the substrate chuck to the two or more tabs of the opening of the first end of the turntable and ii) transfer a second substrate from the two or more pedestals to the two or more tabs of the opening of the second end of the turntable.

3. The imprint lithography method of claim 2, further comprising:

after increasing the distance between the top surface of the turntable and the bottom surface of the substrate chuck, rotating the turntable from the second position to the first position such that i) the two or more cutouts of the opening of the first end are in superimposition with the two or more pedestals and ii) the two or more tabs of the opening of the second end of the turntable are in superimposition with the two or more channels of the substrate chuck.

4. The imprint lithography method of claim 3, further comprising:

after rotating the turntable from the second position to the first position, decreasing the distance between the top surface of the turntable and the bottom surface of the substrate chuck to i) transfer the second substrate from the two or more tabs of the opening of the second end of the turntable to the top surface of the substrate chuck while the two or more tabs of the opening of the second end of the turntable are positioned within the channels of the substrate chuck and ii) transfer the first substrate, having a patterned formed thereon, from the two or more tabs of the opening of the first end of the turntable to the two or more pedestals.

5. The imprint lithography method of claim 1, wherein a plane of the first substrate is maintained during the rotation of the turntable from the first position to the second position.

6. The imprint lithography method of claim 1, after decreasing the distance between the top surface of the turntable and the bottom surface of the substrate chuck, forming a pattern on the first substrate.

7. The imprint lithography method of claim 1, further comprising:

prior rotating the turntable from the first position to the second position, rotating the turntable from the first position to a third position such that the first substrate positioned on the two or more tabs of the opening of the first end of the turntable is in superimposition with an inspection station; and inspecting, by the inspection station and while the turntable is in the third position, the first substrate for one or more defects.

8. An imprint lithography system, comprising:
two or more pedestals;
a substrate chuck having a top surface positioned opposite a bottom surface, and including two or more channels;
a turntable having a top surface and a first end positioned opposite a second end, each of the first and second ends including a respective opening, each opening including two or more cutouts and two or more tabs, the turntable rotatable between first and second positions, the first position having i) the two or more cutouts of the opening of the first end in superposition with the two or more pedestals and ii) a first end of the two or more pedestals extending away from the top surface of the turntable, the second position having i) the two or more tabs of the opening of the first end of the turntable in superimposition with the two or more channels of the substrate chuck and ii) the two or more cutouts of the opening of the second end in superimposition with the two or more pedestals; and an actuator system to, when the turntable is in the first position, decrease a distance between the top surface of the turntable and the first end of two or more pedestals to transfer a first substrate from the two or more pedestals to the two or more tabs of the opening of the first end of the turntable, and when the turntable is in the second position, decrease a distance between the top surface of the turntable and the bottom surface of the substrate chuck to transfer the first substrate from the two or more tabs of the opening of the first end of the turntable to the top surface of the substrate chuck while the two or more tabs are positioned within the channels of the substrate chuck.

9. The imprint lithography system of claim 8, the actuator system further configured to increase the distance the distance between the top surface of the turntable and the bottom surface of the substrate to i) transfer the first substrate, having a patterned formed thereon, from the substrate chuck to the two or more tabs of the opening of the first end of the turntable and ii) transfer the second substrate from the two or more pedestals to the two or more tabs of the opening of the second end of the turntable.

10. The imprint lithography system of claim 8, further comprising a rotational system to rotate the turntable between the first and the second positions.

11. The imprint lithography system of claim 8, wherein a plane of the first substrate is maintained while positioned on the two or more tabs of the opening of the first end of the turntable.

12. The imprint lithography system of claim 8, further comprising a patterning system to form a pattern in the first substrate when the first substrate is positioned on the top surface of the substrate chuck.

13. The imprint lithography system of claim 8, further comprising an inspection station, wherein the turntable is further rotatable to a third position such that the first substrate positioned on the two or more tabs of the opening of the first end of the turntable is in superimposition with an inspection station, the inspection station, when the turntable is in the third position, inspect the first substrate for one or more defects.

* * * * *

UNITED STATES PATENT AND TRADEMARK OFFICE
CERTIFICATE OF CORRECTION

PATENT NO. : 10,025,202 B2
APPLICATION NO. : 15/612079
DATED : July 17, 2018
INVENTOR(S) : Roy Patterson et al.

Page 1 of 1

It is certified that error appears in the above-identified patent and that said Letters Patent is hereby corrected as shown below:

On the Title Page

Column 1, item (72) Inventors, Line 5, delete "Autin, TX" insert -- Austin, TX --.

Signed and Sealed this
Twenty-seventh Day of February, 2024

Katherine Kelly Vidal
*Director of the United States Patent and Trademark Office*